United States Patent [19]

Rafter et al.

[11] 4,326,296
[45] Apr. 20, 1982

[54] TUNING SYSTEM FOR A COLOR TELEVISION RECEIVER HAVING A VARACTOR TUNER

[75] Inventors: Patrick M. Rafter; James E. Hitchcock, both of Knoxville, Tenn.

[73] Assignee: Magnavox Consumer Electronics Co., New York, N.Y.

[21] Appl. No.: 192,723

[22] Filed: Oct. 1, 1980

[51] Int. Cl.³ .................... H04B 1/16; H04B 1/26; H04N 5/50
[52] U.S. Cl. .................... 455/192; 334/16; 358/191.1; 358/195.1; 455/182
[58] Field of Search ............... 455/192, 195, 182, 196, 455/197, 198, 199; 334/14, 15, 16; 358/195.1, 191.1

[56] References Cited

U.S. PATENT DOCUMENTS

| | | | |
|---|---|---|---|
| 3,965,427 | 6/1976 | Ma | 455/182 |
| 4,081,771 | 3/1978 | Hendrickson | 455/195 |
| 4,122,493 | 10/1978 | Arumugham | 455/192 |
| 4,125,863 | 11/1978 | Arumugham | 455/195 |
| 4,234,962 | 11/1980 | Hoeft | 455/182 |
| 4,262,307 | 4/1981 | Brun | 358/195.1 |
| 4,262,364 | 4/1981 | Fujita | 455/182 |
| 4,263,675 | 4/1981 | Hongu | 455/192 |

*Primary Examiner*—Howard Britton
*Attorney, Agent, or Firm*—Pitts & Kesterson

[57] ABSTRACT

An improved tuning system for a color television receiver embodying a varactor tuner having a controller functioning as a potentiometer to provide a preselected tuning voltage for channel selection. The system includes a tuning voltage supply having a low impedance drive which is serially connected at its output with the controller. The voltage supply applies a preselected source voltage to the controller which is substantially independent of changes in the resistive value of the controller. The tuning voltage supply is combined with automatic fine tuning correction circuitry connected between the automatic fine tuning system and the varactor tuner. The automatic fine tuning correction circuitry applies a correction voltage to the varactor tuner for temperature compensation, fine tuning errors of 500 KHZ or less, etc.

9 Claims, 3 Drawing Figures

TUNING SYSTEM FOR A COLOR TELEVISION RECEIVER HAVING A VARACTOR TUNER

BACKGROUND OF THE INVENTION

This invention relates to a tuning voltage supply and automatic fine tuning correction circuitry for color television receivers employing varactor tuners.

Certain state of the art color television receivers incorporate a controller which comprises a resistive element with switch selected taps for selecting a desired channel by varying the controller voltage thereby setting the tuner voltage. This voltage is applied to the varactor tuner and controls the oscillator frequency. The controller is normally operated by a single knob positioned on the front panel of the receiver such that an operator can readily select the desired channel by adjustment of the knob. While the material, which serves as the resistive element of certain controllers, has desired characteristics in conjunction with varactor tuners, the resistive material is sensitive to temperature changes, humidity and other ambient conditions. Slight changes or fluctuations in the resistance of the material cause concomitant changes in the tuner voltage with a resultant drift in the frequency of the signal received and amplified. Accordingly, the quality of the reproduction of the scene telecast by the station may be diminished or the channel received may not correspond with the dial channel indication.

In order for a controller to function properly, it is necessary for a preselected source voltage to be applied to it such that the output of the controller, the tuner voltage, is predetermined. Otherwise, the tuner voltage will drift and cause a spurious change in the oscillator frequency. Moreover, the tuner operation is enhanced if a preselected correction voltage is superimposed on the automatic fine tuner voltage fed into the tuner.

Accordingly, it is an object of this invention to provide an improved tuning system for a color television receiver embodying a varactor tuner having a controller which provides a preselected tuning voltage. Another object of the invention is to provide an improved tuning system which includes a tuning voltage supply that feeds a preselected source voltage to the controller. A further object of the invention is to provide a tuning voltage supply having a low impedance drive for applying a preselected source voltage to the controller such that the source voltage is substantially independent of the resistive value of the controller. Yet another object of the invention is to provide an automatic fine tuning interface combined with a low impedance tuning voltage supply such that the automatic fine tuning interface supplies a correction voltage to the varactor tuner to compensate for tuner oscillator frequency errors due to temperature drift or customer misadjustment. Other objects and advantages of the invention will become apparent upon reading the following specification together with the drawings in which:

SUMMARY OF THE INVENTION

An improved tuning system is provided for a color receiver embodying a varactor tuner having a controller which provides a preselected tuning voltage and an automatic fine tuning system. The tuning system includes a low impedance tuning voltage supply which is serially connected at its output with the controller. The voltage supply applies a preselected source voltage to the controller such that the supply voltage is substantially independent of changes in the resistive value of the adjustable controller and ambient conditions. An automatic fine tuning interface is combined with the tuning voltage supply and is serially connected between the automatic fine tuning system and the varactor tuner. The automatic fine tuning interface applies a correction voltage to the varactor tuner.

DESCRIPTION OF THE PREFERRED EMBODIMENT

Figure 1:
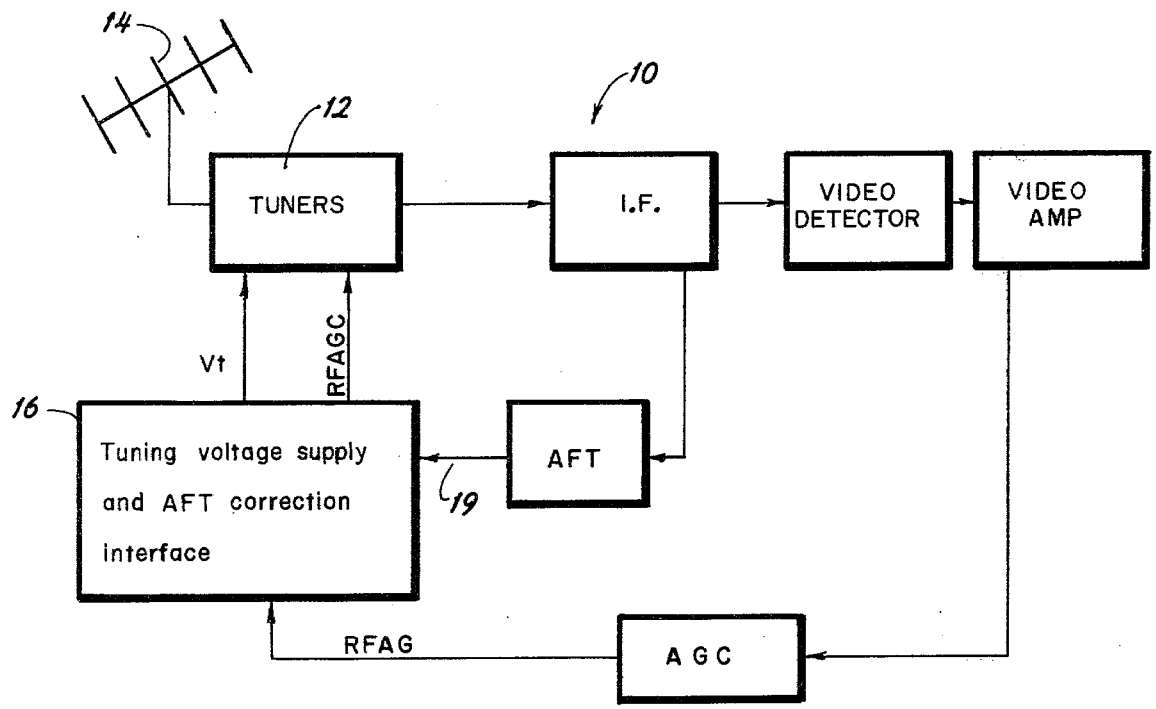
FIG. 1 is a block diagram of a portion of a color television receiver incorporating an improved tuning system constructed in accordance with various features of the invention.

Referring now to the Figures, FIG. 1 illustrates a block diagram of a portion of a color television receiver incorporating an improved tuning system illustrated generally at 10 which is constructed in accordance with various features of the invention. The illustrated tuning system includes varactor tuners 12 which are tuned by electronic means and employ reverse-biased diodes which act as voltage-controlled variable capacitors (varactors). As is well known in the art, the varactors tune the antenna 14, the rf amplifiers and the oscillators incorporated in the tuners. The tuner voltage (Vt) applied to the varactor tuner 12 is produced at the output of the controller 18 (See FIGS. 2 and 3) which comprises a resistive potentiometer incorporating a material such as carbon filament as the resistive element. A desired channel is selected by varying the tap position on the controller resistance which sets the tuner voltage (Vt) at the center arm of the controller. This voltage (Vt) is applied to the varactor tuners to control the oscillator frequency and accordingly the frequency of the signal received.

The varactor tuner voltage is produced by the circuitry 16 comprising a combined tuning voltage supply 16a and automatic fine tuning interface 16b. This circuitry supplies a source or control voltage (Vs) in the preferred embodiment of approximately 27–30 volt to the tuning potentiometer incorporated in the circuitry 16.

As is illustrated in FIG. 1, the tuning voltage supply and the automatic fine tuning interface generally indicated at 16 are combined in accordance with various features of the invention and incorporate certain common circuit elements. For descriptive purposes, the tuning voltage supply will be described and then the automatic fine tuning interface which embodies certain components of the tuning voltage supply will be described.

Figure 2:
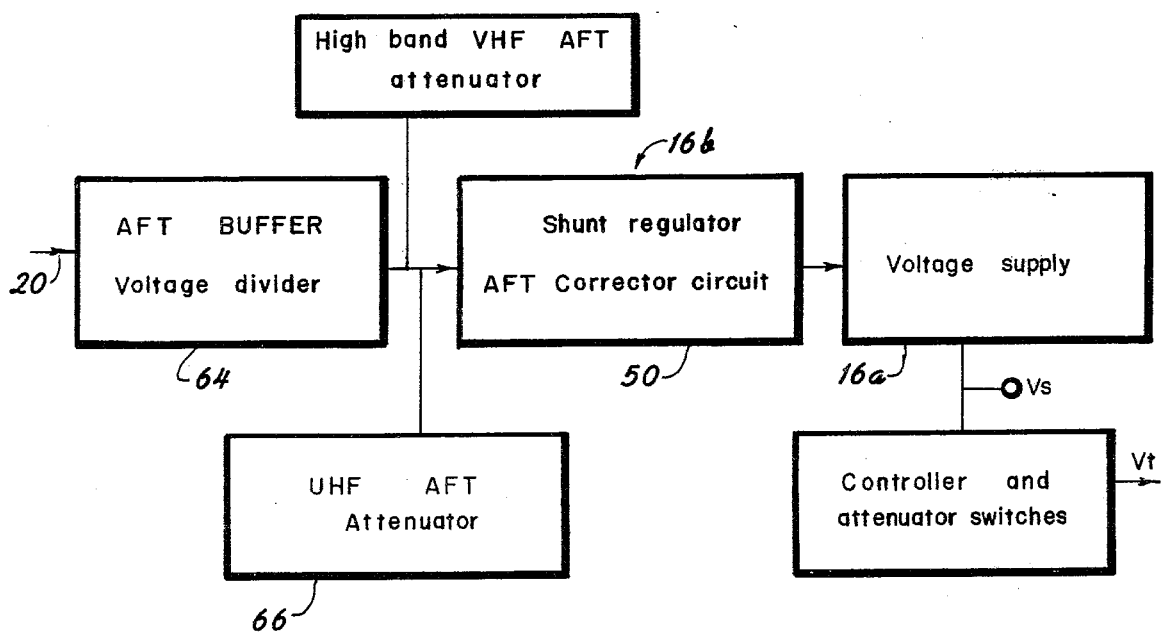
FIG. 2 is a block diagram of the combined tuning voltage supply and automatic fine tuning interface illustrated in FIG. 1.
Figure 3:
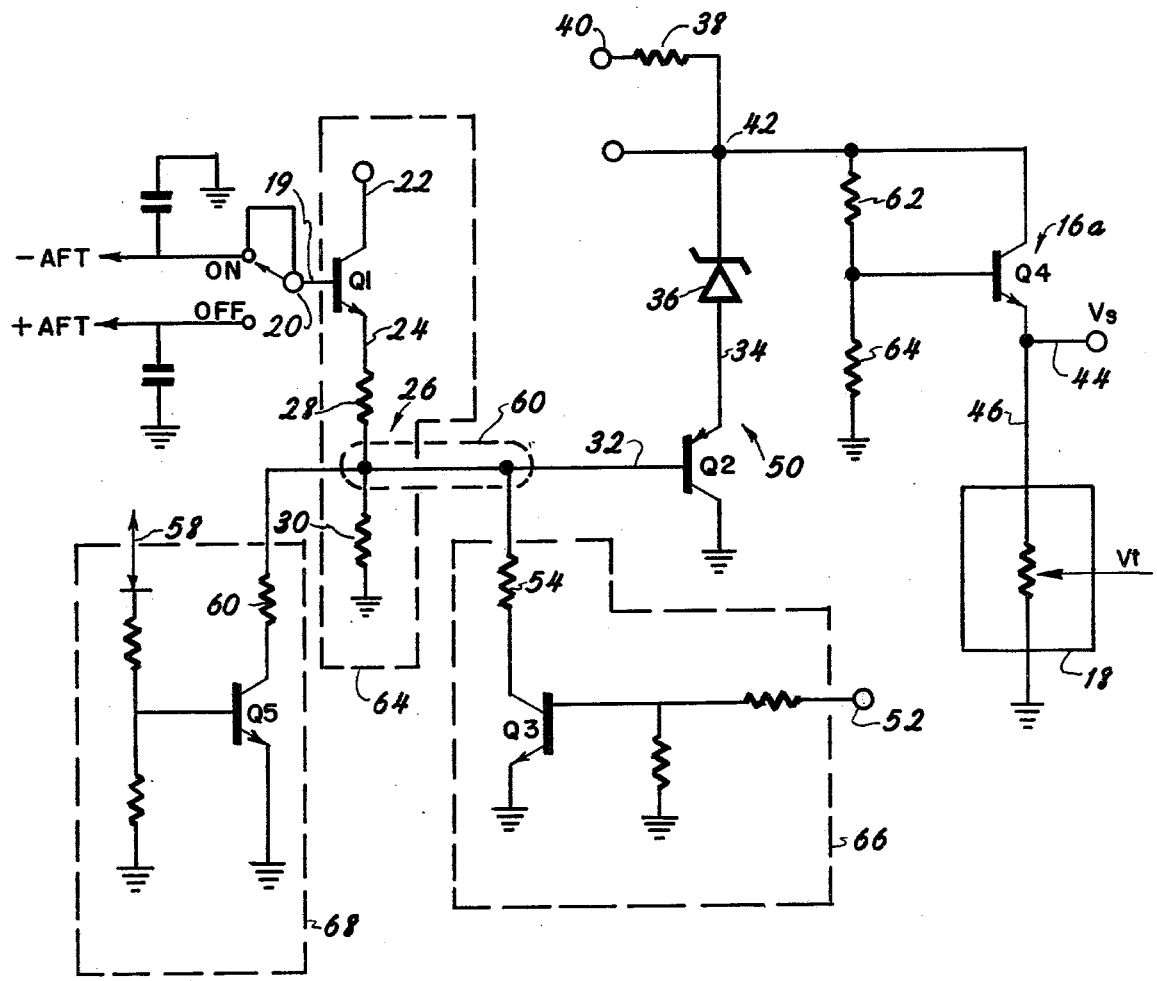
FIG. 3 is a schematic diagram of the combined tuning voltage supply and automatic fine tuning interface illustrated in FIGS. 1 and 2.

The tuning voltage supply is illustrated at 16a in the block diagram of FIG. 2 and in the schematic diagram of FIG. 3. The tuning voltage supply is also shown in FIG. 1 which illustrates, together with FIGS. 2 and 3, that the automatic fine tuning (AFT) system is connected through line 19 and switch 20 to the base of the transistor Q1. This transistor Q1 is operated as an emitter follower and serves as a buffer 64 for the automatic fine tuning system as will be described in greater detail hereinafter. The collector 22 of the transistor Q1 is connected with a chassis voltage supply which provides 24 volts at the collector in the preferred embodiment. When the switch 20, which is controlled by operation of the controlled 18, is in the "on" position as illustrated in FIG. 2 the automatic fine tuning system supplies a preselected nominal voltage (6.5 volts in the preferred embodiment) to the base of the transistor Q1. The emitter 24 of the transistor Q1 is connected through a voltage divider network generally indicated at 26 which comprises the resistors 28 and 30.

The output of the AFT buffer and voltage divider 26 is fed to a shunt regulator 50 of the voltage supply 16a. More specifically, the voltage developed across the resistor 30 is applied to the base 32 of the transistor Q2. The emitter 34 of transistor Q2 is connected through the zener diode 36 and the resistor 38 to a chassis voltage supply through the lead 40. In the preferred embodiment the chassis voltage supply (not shown) applies 250 volts to the lead 40. A stable voltage source is developed by the diode 36 and the transistor Q2. In the preferred embodiment the voltage developed at the node 42 between the cathode of the zener diode 36 and ground is 37 volts.

This voltage developed at the node 42 is fed to the final stage of the tuning voltage supply 16a which includes the transistor Q4 which is operated as an emitter follower and which serves as a series voltage regulator. A source voltage Vs is developed at the emitter 44 of the transistor Q4 and applied to the input 46 of the controller 18. This source voltage Vs is substantially independent of changes in the resistive value of the controller 18 inasmuch as the controller is driven with the tuning voltage supply 16a having low output impedance.

An automatic fine tuning interface 16b is serially connected between the automatic fine tuning system as shown in the block diagram of FIG. 1 and the varactor tuner. This automatic fine tuning interface includes circuit elements common with the tuning voltage supply and applies a preselected correction voltage to the tuner. More specifically, with the switch 20 in the "off" position the positive and negative automatic fine tuning lines are shorted together and a nominal voltage is applied to the base of the AFT buffer transistor Q1. This nominal voltage in the preferred embodiment is plus 6.5 volts. As described hereinabove, transistor Q1 is an emitter follower with a voltage divider comprising resistors 28 and 30 which serve as the emitter resistors. The voltage developed across the resistor 30 biases the transistor Q2 and serves as a reference voltage for the shunt regulator and AFT correction circuit which comprises the transistor Q2 and the diode 36.

In order to apply automatic fine tuning correction, the switch 20 is connected to the minus AFT line, or placed in the "on" position. As the oscillator frequency is increased for any reason, such as because of temperature drift, the AFT correction voltage is decreasing. The AFT correction voltage which is the delta from the nominal voltage is applied to the base of the transistor Q1 and a preselected percentage of this base voltage is developed across the resistor 30 and applied to the input of the AFT correction amplifier in the VHF operation. In the preferred embodiment, the resistor 28 is 1,000 ohms and the resistor 20 is 2,000 ohms such that 66% of the base voltage of the transistor Q1 is applied to the base of automatic fine tuning correction amplifier.

During UHF operation the transistor Q3 is switched "on" by a controller switch which applies, in the preferred embodiment, 24 V to the connection 52 causing the transistor Q3 to saturate thereby placing the resistor 54 in parallel with the resistor 30. Preferably, the resistor 54 has the value of approximately 270 ohms thereby attenuating the voltage applied to the base of the AFT correction circuit Q2. The AFT is reduced by 34% in the low band VHF mode, 60% in the hi band VHF mode and 85% in the UHF mode. These reductions in AFT are necessary to accomodate the increasing oscillator sensivity (MHZ/V) in going from low band VHF to high band VHF, to UHF operation, to accomodate the variations in the tuner slope, i.e. frequency Vs tuning voltage applied.

For high band VHF operation a band switch in the controller applies a source voltage (24 V in the preferred embodiment) at connection 58 which switches the transistor Q5 "on" causing it to saturate which places the resistor 60 across or in parallel with the resistor 30. Additionally, a controller switch turns transistor Q3 of the UHF attenuator "off". Preferably the resistor 60 has a value of approximately 1,000 ohms and with the resistor 80 having a value of approximately 2,000 ohms the percentage of the delta from nominal voltage applied to the base of Q1 is reduced to approximately 40% and this AFT correction voltage is applied to the AFT amplifier 50.

It should be recognized that the voltage developed at the output 42 of the AFT correction circuit and fed to the tuning voltage supply 18 follows the voltage developed between the node 60, which is the input of the AFT correction amplifier, and ground. More specifically, in low band VHF operation transistors Q3 and transistor Q5 are switched "off" by the controller switch which disconnects the base of each transistor from its respective power source. In this condition, the voltage delta, i.e., the correction voltage developed across the resistor 80 is amplified by the AFT correction circuit including transistor Q2. Thus, the change in the voltage developed between the node 60 and ground is reflected between the cathode of the zener diode and ground.

In UHF operation, transistor Q5 is switched "off" and transistor Q3 is switched "on" by a controller switch operated during channel selection. Transistor Q3 and the associated resistive network indicated generally at 66 serve as a UHF AFT attenuator and place the resistor 54 in parallel with the resistor 30 such that the voltage developed between the node 60 and ground and which is fed into the AFT correction circuit is attenuated by approximately 80%–85% in the preferred embodiment.

In high band VHF operation, transistor Q3 is switched "off" and transistor Q5 is switched "on" by a band switch in the controller. Transistor Q5 and the associated resistive network indicated generally at 68 serve as a high band VHF attenuator and place the resistor 60 in parallel with resistor 30 when transistor Q5 is switched "on". In this condition, the voltage developed between the node 60 and ground and which is fed into the AFT correction amplifier is attenuated by approximately 60% in the preferred embodiment.

In each of the VHF, UHF and high band VHF reception operations, the delta or change in the voltage developed between the node 60 and ground, the input of the AFT correction circuitry, is reflected at the output of the AFT correction voltage amplifier, or more specifically between the cathode of the zener diode and ground. This delta voltage or voltage change developed across the shunt regulator/AFT correction amplifier is applied to the base of the transistor Q4 through the resistors 62 and 64 which serve as a voltage divider and attenuate the input of tuning voltage supply. In the preferred embodiment the voltage divider attenuates the voltage applied to the base of Q4 from the cathode of the zener diode by approximately 22%. There is a resultant reduction of the AFT voltage component of the supply voltage (Vs) for VHF and UHF operations.

From the foregoing detailed description it will be apparent to those skilled in the art, that an improved tuning system for a color television receiver embodying a varactor tuner having a controller functioning as a potentiometer has been described and illustrated which incorporates various advantages over the prior art. The tuning system includes a tuning voltage supply which has a low impedance drive such that the voltage supplied to the controller is substantially independent of changes in the resistive value of the controller. An automatic fine tuning interface is combined with the tuning voltage supply and incorporates common circuit elements which reduce the manufacturing cost of the system. This fine tuning interface includes UHF and high band VHF correction voltage attenuators selectively energized by controller switches. These attenuators develop changes in the voltage applied to the tuner which compensate for changes in the oscillator sensivity from band to band and thereby enhance the accuracy of the tuning operation. The circuit is naturally temperature compensated from 0° C. to 65° C. over ambient temperature excursions, since the Q2 and Q4 emitter to base voltages will change in opposite directions such that Vs is relatively stable with temperatures.

While a preferred embodiment of the combined voltage supply and automatic fine tuning interface has been shown and described it will be understood that there is no intention to limit the invention by such disclosure, but rather it is intended to cover all modifications and alternate constructions falling within the spirit and scope of the invention as defined in the appended claims.

We claim:

1. An improved tuning system for a color television receiver embodying a varactor tuner having a controller means and an automatic fine tuning system said controller means including a resistive element with switch selected taps for selecting the desired channel and switch means, comprising:
a low impedance tuning voltage supply serially connected at its output with said controller means, said voltage supply applying a preselected regulated source voltage to said controller means whereby said supply voltage is substantially independent of changes in the resistive value of said controller means, and
automatic fine tuning interface serially connected between said automatic fine tuning system and said varactor tuner, said automatic fine tuning interface applying correction voltage to said varactor tuner.

2. The improved tuning system of claim 1 wherein said tuning voltage supply and said automatic fine tuning interface incorporates certain common circuit elements.

3. The automatic fine tuning interface of claim 1 which applies a first automatic fine tuning correction voltage to said tuner during VHF operation, a second automatic fine tuning correction voltage to said tuner during UHF operation and a third automatic fine tuning correction voltage to said tuner during high band VHF operation.

4. The automatic fine tuning interface of claim 3 wherein said second automatic fine tuning correction voltage which is applied to said tuner during UHF operation is changed by a UHF automatic fine tuning attenuator selectively operated by said controller switch means.

5. The automatic fine tuning interface of claims 3 or 4 wherein said third automatic fine tuning correction voltage applied to said tuner during high band VHF operation is changed by a high band VHF attenuator selectively operated by controller switch means.

6. The improved tuning system of claim 1 wherein said tuning voltage supply and said automatic fine tuning interface include an automatic fine tuning buffer having a transistor operated as an emitter follower, the emitter of said transistor feeding a voltage divider network.

7. The improved tuning system of claim 1 wherein said tuning voltage supply and said automatic fine tuning interface includes a circuit stage which serves as a shunt regulator for said voltage supply and an automatic fine tuning correction amplifier for said automatic fine tuning interface.

8. The improved tuning system of claim 7 wherein said shunt regulator and said automatic fine tuning correction circuit includes a transistor serially connected with a zener diode whereby the voltage at the cathode of said zener diode is controlled.

9. An improved tuning system for a color television receiver embodying a varactor tuner having a controller and an automatic fine tuning system, said controller including a resistor and functioning as a potentiometer and switch means, comprising:
a low impedance tuning voltage supply serially connected at its output with said controller, said voltage supply applying a preselected source voltage to said controller whereby said supply voltage is substantially independent of changes in the resistive value of said controller, and including a shunt regulator which generates a controlled voltage at its output which is fed to the input of a transistor operated as an emitter follower, and
automatic fine tuning interface serially connected between automatic fine tuning system and said varactor tuner, said automatic fine tuning interface applying correction voltage to said varactor tuner, said automatic fine tuning interface including a UHF attenuator which is energized during UHF operations, and a high band VHF attenuator which is energized during high band VHF operations.

* * * * *